United States Patent
Yang (10) Patent No.: US 9,396,966 B1
(45) Date of Patent: Jul. 19, 2016

(54) PATTERNING METHOD AND SEMICONDUCTOR STRUCTURE

(71) Applicant: MACRONIX International Co., Ltd., Hsinchu (TW)

(72) Inventor: Chin-Cheng Yang, Hsinchu (TW)

(73) Assignee: MACRONIX International Co., Ltd., Hsinchu (TW)

( * ) Notice: Subject to any disclaimer, the term of this patent is extended or adjusted under 35 U.S.C. 154(b) by 0 days.

(21) Appl. No.: 14/582,924

(22) Filed: Dec. 24, 2014

(51) Int. Cl.
*H01L 21/02* (2006.01)
*H01L 21/3213* (2006.01)
*H01L 21/311* (2006.01)

(52) U.S. Cl.
CPC ...... *H01L 21/32139* (2013.01); *H01L 21/0254* (2013.01); *H01L 21/02282* (2013.01); *H01L 21/31144* (2013.01)

(58) Field of Classification Search
CPC .......... H01L 27/11565; H01L 21/32139; H01L 21/0254; H01L 21/02282; H01L 33/0025; H01L 33/0075
USPC ........................................... 438/47
See application file for complete search history.

(56) References Cited

U.S. PATENT DOCUMENTS

| | | | | |
|---|---|---|---|---|
| 2010/0035191 A1* | 2/2010 | Huang | ............. | H01L 21/31144 430/323 |
| 2012/0181701 A1* | 7/2012 | Chen | ............. | H01L 23/50 257/774 |
| 2013/0037860 A1* | 2/2013 | Jang | ............. | H01L 27/11519 257/211 |
| 2013/0236836 A1* | 9/2013 | Sun | ............. | G03F 7/70 430/322 |
| 2014/0024215 A1* | 1/2014 | Cheng | ............. | H01L 21/0337 438/689 |
| 2014/0061766 A1* | 3/2014 | Kito | ............. | H01L 27/11565 257/324 |
| 2014/0187029 A1* | 7/2014 | Seol | ............. | H01L 29/42332 438/586 |
| 2015/0001735 A1* | 1/2015 | Mignot | ............. | H01L 23/5226 257/774 |
| 2015/0262836 A1* | 9/2015 | Lu | ............. | H01L 21/31138 438/703 |

* cited by examiner

*Primary Examiner* — Nathan Ha
(74) *Attorney, Agent, or Firm* — J.C. Patents (57) ABSTRACT

A patterning method and a patterned material layer are provided. After providing a substrate including a material layer, a hard mask layer including trenches extending in a first direction is formed over the material layer. A filling material layer is formed on the hard mask layer to cover the hard mask layer and fills in the trenches. A mask layer in a grid pattern is formed on the filling material layer. The mask layer includes first grid lines extending in the first direction and second grid lines extending in a second direction, and each of the underlying trench is located between two most adjacent first grid lines. The material layer is etched with the mask layer as an etching mask to form a patterned material layer including a plurality of first holes and a plurality of second holes.

13 Claims, 8 Drawing Sheets

PATTERNING METHOD AND SEMICONDUCTOR STRUCTURE

BACKGROUND OF THE INVENTION

1. Field of the Invention

The invention relates to an integrated circuit and more particularly relates to a patterning method and a semiconductor structure.

2. Description of Related Art

Immersion lithography is a technology where the lithographic exposure is applied to a resist-coated wafer with purified water introduced between the scanner and the wafer. The immersion lithography techniques, such as ArF immersion lithography, presently is confined to the pitch of about 76 nm in one single patterning process. If the device of a smaller pitch is desired, alternative optical tools or supplemental lithographic and etching processes may be required.

SUMMARY OF THE INVENTION

Accordingly, the invention provides a patterning method, adapted for obtaining smaller pattern pitch and critical dimension and for aligning the formed patterns with each other, so as to overcome misalignment and improve critical dimension uniformity.

The patterning method of the invention includes the following. A substrate comprising a material layer is provided. A hard mask layer is formed over the material layer, wherein the hard mask layer includes a plurality of trenches extending in a first direction. Then, a filling material layer is formed on the hard mask layer, wherein the filling material layer covers the hard mask layer and fills in the trenches. Next, a mask layer is formed on the filling material layer, wherein the mask layer is in a grid pattern includes a plurality of first grid lines extending in the first direction parallel to one another and a plurality of second grid lines extending in a second direction parallel to one another, and each of the trenches is located within a space range between two most adjacent first grid lines. Afterwards, the filling material layer is etched with the mask layer as an etching mask to form a patterned filling material layer and a remaining filling material layer, wherein the remaining filling material layer fills in the trenches. After that, the hard mask layer is etched using the mask layer and the underlying patterned filling material layer as etching masks to form a patterned hard mask layer. Then, the material layer is etched using the patterned hard mask layer, the patterned filling material layer and the remaining filling material layer as etching masks, so that a patterned material layer including a plurality of first holes and a plurality of second holes is formed.

In an embodiment of the invention, the mask layer has a plurality of third holes defined by the first grid lines and the second grid lines.

In an embodiment of the invention, the third holes are arranged in an may.

In an embodiment of the invention, a critical dimension of each of the third holes in the first direction is smaller than a critical dimension of each of the third holes in the second direction.

In an embodiment of the invention, a dimension of each of the first holes in the first direction is equivalent to a dimension of each of the second holes in the first direction, and is equivalent to the critical dimension of each of the third holes in the first direction.

In an embodiment of the invention, the first holes and the second holes are arranged in an array to define a grid pattern of the patterned material layer.

In an embodiment of the invention, when the mask layer is formed and each of the trenches is located between and in the midst of the two most adjacent first grid lines, the plurality of first holes and the plurality of second holes of the patterned material layer have equal sizes.

In an embodiment of the invention, when the mask layer is formed and each of the trenches is located between but not in midst of the two most adjacent first grid lines, the first holes and the second holes of the patterned material layer have different sizes.

In an embodiment of the invention, the hard mask layer includes advanced patterning film.

In an embodiment of the invention, the filling material layer is a silicon-containing hard-mask layer formed by spin-coating method.

In an embodiment of the invention, the patterning method further includes forming a removable hard mask layer and a stop layer in sequence on the material layer beneath the hard mask layer.

In an embodiment of the invention, the removable hard mask layer includes advanced patterning film.

In an embodiment of the invention, a material of the stop layer includes silicon nitride (SiN).

The invention further provides a semiconductor structure including a patterned material layer disposed on a substrate. The patterned material layer includes a grid pattern defined by a plurality of holes arranged in an array and the holes consists of pairs of holes, wherein a dimension of each of the holes in a first direction is equivalent and each hole of one pair of holes has a side parallel with each other in a first direction.

In an embodiment of the invention, a dimension of each of the holes in a second direction is equivalent.

According to the patterning method of the invention, by forming a mask layer having a plurality of holes overlaying on the underlying hard mask layer having a plurality of trenches to serve as the masks (i.e. double pattern mask layer) for a single etching process, smaller pattern pitch and smaller critical dimension can be obtained, and the resultant patterns are better aligned with each other, thereby overcoming misalignment and improving the critical dimension uniformity.

In the patterned material layer of the semiconductor structure of the invention, the sides of each hole in the first direction and the second direction are aligned respectively. Thus, higher critical dimension uniformity is achieved.

To make the aforementioned and other features and advantages of the invention more comprehensible, several embodiments accompanied with drawings are described in detail as follows.

BRIEF DESCRIPTION OF THE DRAWINGS

The accompanying drawings are included to provide a further understanding of the invention, and are incorporated in and constitute a part of this specification. The drawings illustrate embodiments of the invention and, together with the description, serve to explain the principles of the invention.

DESCRIPTION OF THE EMBODIMENTS

Reference will now be made in detail to the present preferred embodiments of the invention, examples of which are illustrated in the accompanying drawings. Wherever possible, the same reference numbers are used in the drawings and the description to refer to the same or like parts.

FIG. 1A to FIG. 1G are schematic top views showing a patterning method according to an embodiment of the invention. FIG. 2A to FIG. 2G are schematic cross-sectional views taken along the line A-A' of FIG. 1A to FIG. 1G.

Figure 1A:
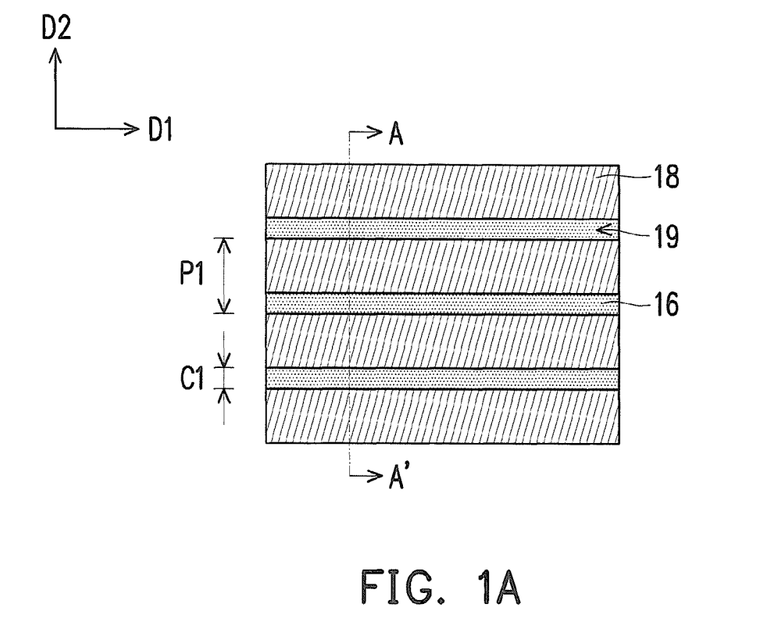
FIG. 1A to FIG. 1G are schematic top views showing a patterning method according to an embodiment of the invention.
Figure 1B:
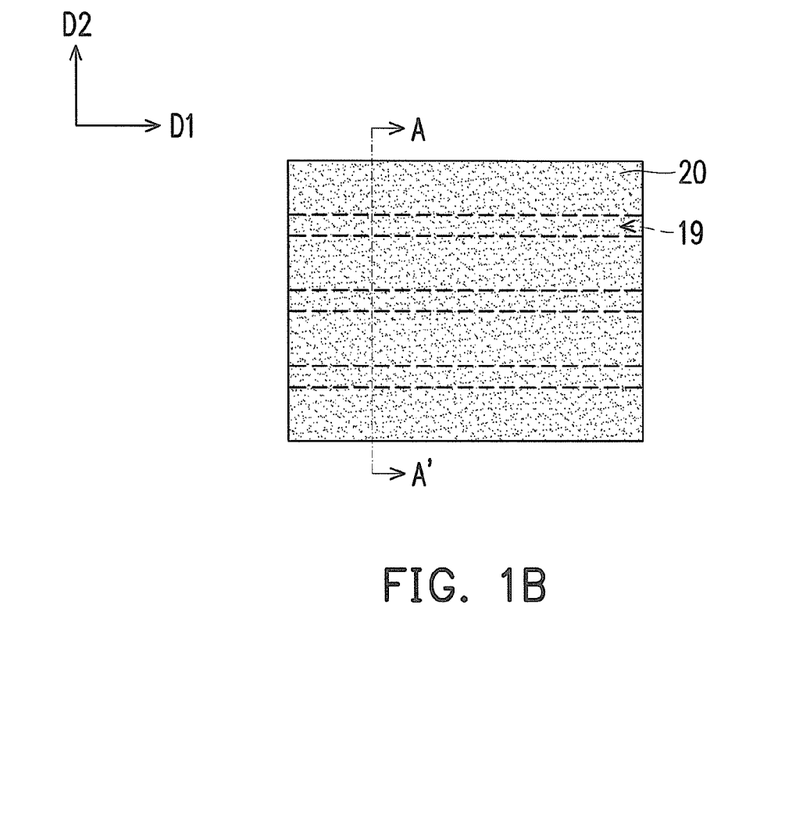
Figure 2A:
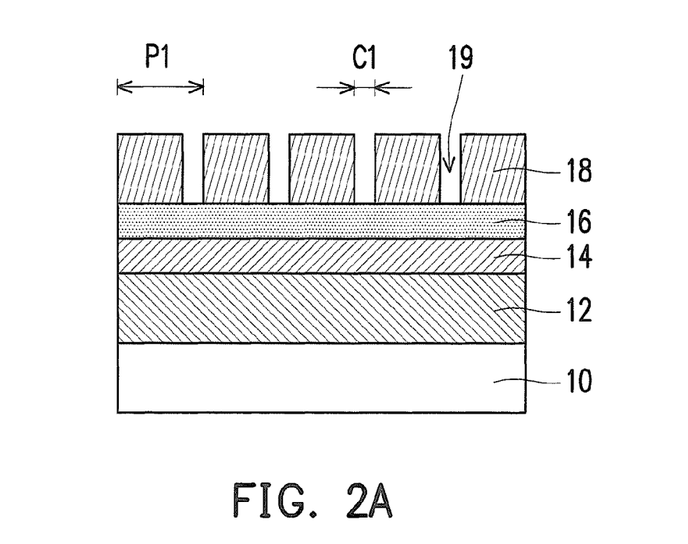
FIG. 2A to FIG. 2G are schematic cross-sectional views taken along the line A-A' of FIG. 1A to FIG. 1G.
Figure 2B:
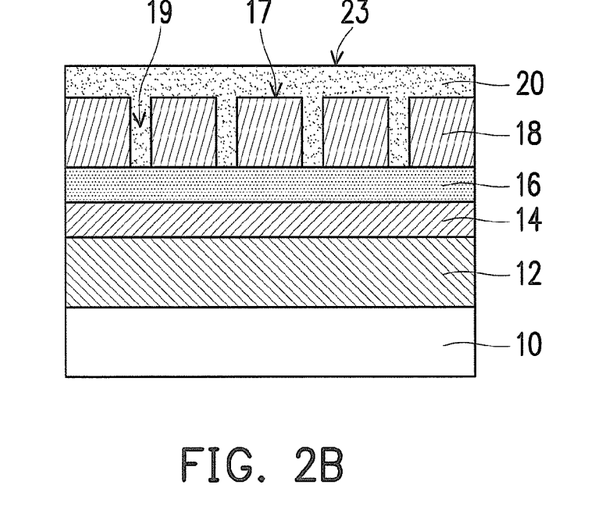

With reference to FIG. 1A and FIG. 2A, a substrate 10 is provided, and a material layer 12 is formed on the substrate 10. The substrate 10 is a semiconductor substrate, a III-V semiconductor compound substrate, or a semiconductor over insulator (SOI) substrate, for example. The material layer 12 is a conductor layer, and a material thereof is metal, polysilicon, polycide, or metal silicide, for example, but the invention is not limited thereto. The substrate 10 may further include one or more dielectric layers, one or more semiconductor material layers and/or semiconductor devices disposed between the substrate 10 and the material 12, but the invention is not limited thereto. Then, a removable hard mask layer 14, a stop layer 16, and a hard mask layer 18 are formed in sequence on the material layer 12. A material of the removable hard mask layer 14 and a material of the hard mask layer 18 may be the same. The removable hard mask layer 14 and the hard mask layer 18 may be carbon-containing advanced patterning films (APF) formed by chemical vapour deposition (CVD), for example. The material of the stop layer 16 may be SiN, for example. The hard mask layer 18 has a plurality of trenches 19 extending in a first direction D1 that expose a portion of the stop layer 16. In an embodiment of the invention, a critical dimension (CD) C1 of each of the trenches 19 in a second direction D2 is about 21 nm, while a pitch P1 of each of the trenches 19 in the second direction D2 is about 86 nm, for example. The dimension or pitch described in this embodiment is merely for illustration purposes, but the scope of the present invention is not limited thereto. The second direction D2 is different from the first direction D1. The second direction D2 and the first direction D1 may be perpendicular to each other, for example. The first direction D1 may be an X direction or a Y direction, and the second direction D2 may be the Y direction or the X direction. In the figures of this embodiment, the first direction D1 is the X direction and the second direction D2 is the Y direction, for example. The process of forming the hard mask layer 18 includes, for example, forming a hard mask material layer (not illustrated) and then patterning the hard mask material layer using an anisotropic or dry etching process to form the hard mask layer 18 with a plurality of trenches 19 therein.

With reference to FIG. 1A to FIG. 1B and FIG. 2A to FIG. 2B, a filling material layer 20 is formed over the hard mask layer 18, and the filling material layer 20 covers the hard mask layer 18 and fills up the trenches 19. The top surface 23 of the filling material layer 20 is higher than a top surface 17 of the hard mask layer 18. The filling material layer 20 may be a silicon-containing hard-mask (SHB) layer, which also function as a bottom anti-reflection coating (BARC) layer, for example. The process of forming the filling material layer 20 may be spin-coating method, for example.

Figure 1C:
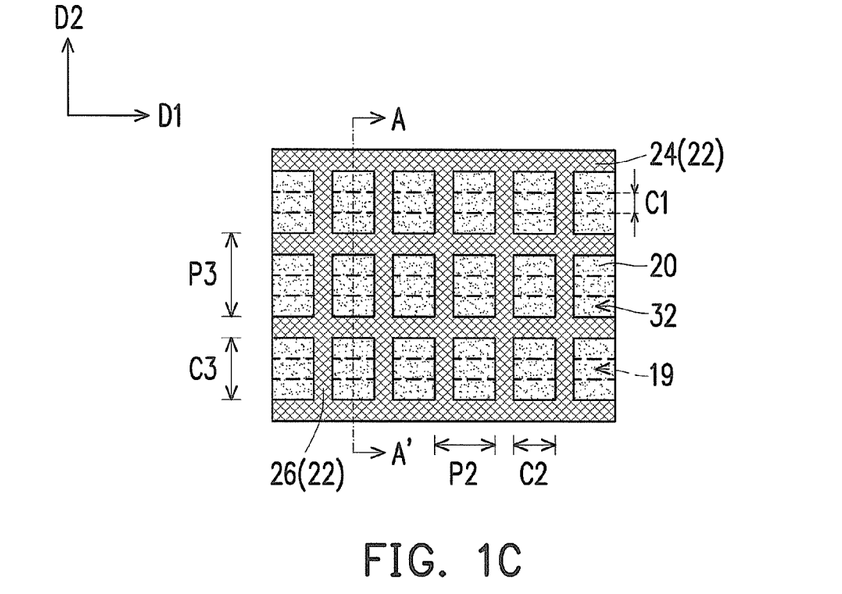
Figure 1D:
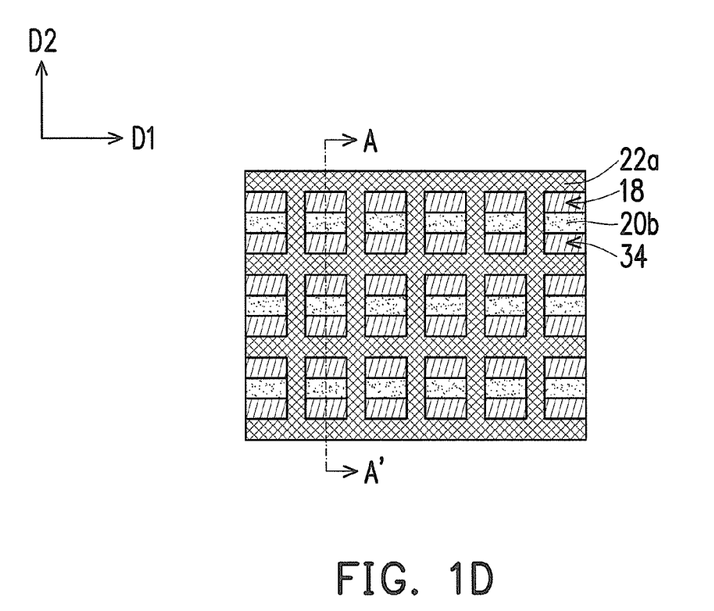

With reference to FIG. 1B to FIG. 1C and FIG. 2B to FIG. 2C, a mask layer 22 is formed on the filling material layer 20. The mask layer 22 is a patterned photoresist layer, for example. A method of forming the patterned photoresist layer may include first forming a photoresist material layer, then performing an exposure process, and thereafter performing a developing process, for example. The mask used in the exposure process may be a halftone phase shift mask, a binary mask, or an opaque molybdenum silicon on glass mask; and the light source may be deep ultraviolet excimer lasers, such as krypton fluoride laser at 248 nm wavelength or the argon fluoride laser at 193 nm wavelength, or even extreme ultraviolet (EUV) light source, for example. With reference to FIG. 1C, the mask layer 22 is in a grid pattern having a plurality of holes 32 arranged in an array, for example. The mask layer 22 has a plurality of first grid lines 24 extending in the first direction D1 parallel to one another and a plurality of second grid lines 26 extending in the second direction D2 parallel to one another, and the holes 32 defined by the first and second grid lines 24, 26 expose a portion of the filling material layer 20. More specifically, a CD C2 of each of the holes 32 in the first direction D1 is smaller than a CD C3 of each of the holes 32 in the second direction D2. In addition, from the top view, each one of the trenches 19 is located between two most adjacent first grid lines 24, for example. More specifically, the CD C3 of each of the holes 32 in the second direction D2 is larger than the CD C1 of each of the trenches 19 in a second direction D2. In this embodiment, each of the trenches 19 is located between and in the midst of two most adjacent first grid lines 24, for example. A pitch P2 in the first direction D1 and the pitch P3 in the second direction D2 of each of the holes 32 are the same, for example. For example, the CD C2 of each of the holes 32 in the first direction D1 is about 43 nm, and the CD C3 of each of the holes 32 in the second direction D2 is about 64 nm, for example. The pitch P2 in the first direction D1 and the pitch P3 in the second direction D2 of each of the holes 32 are both about 86 nm, for example. However, it is understood that the pitch P2 in the first direction D1 and the pitch P3 in the second direction D2 of each of the holes 32 may be different, and whether they are the same or different may be decided according to the pattern design.

With reference to FIG. 1C to FIG. 1D and FIG. 2C to FIG. 2D, using the mask layer 22 as an etching mask, a first etching process is performed to the filling material layer 20 and the filling material layer 20 is etched until the hard mask layer 18 is exposed to form a patterned filling material layer 20a located on the hard mask layer 18 and a remaining filling material layer 20b remained within the trenches 19. The first etching process may be an anisotropic etching process, such as a dry etching process with etching selectively toward the filling material layer 20 over the hard mask layer 18. Due to the high etching selectivity of the first etching process, the etching stops when reaching the hard mask layer 18 so that the remaining filling material layer 20b remains in the trenches 19. The mask layer 22 is partly removed in the first etching process, and the remained mask layer 22a becomes thinner. From the top view in FIG. 1D, it is seen that the remaining filling material layer 20b and a portion of the hard mask layer 18 are exposed by the holes 34 that are defined by the remained mask layer 22a and the patterned filling material layer 20a.

Figure 1E:
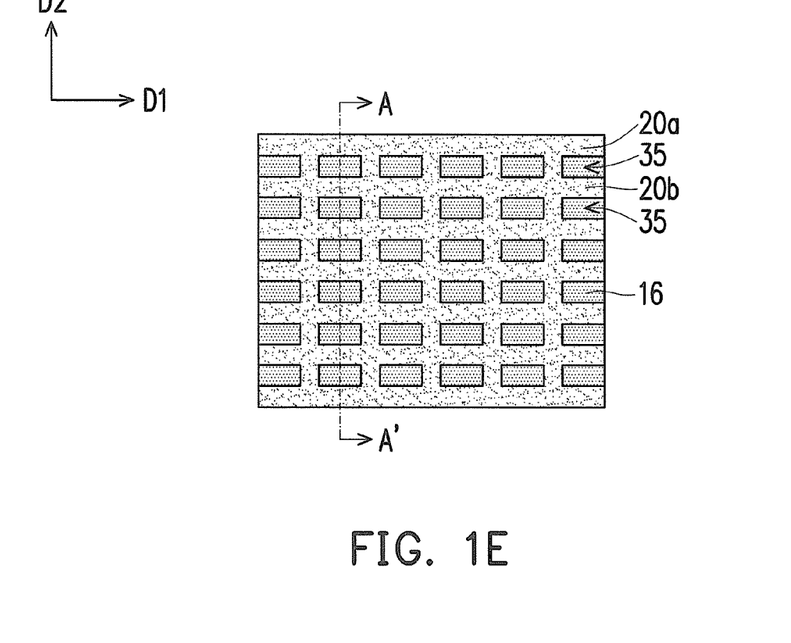
Figure 1F:
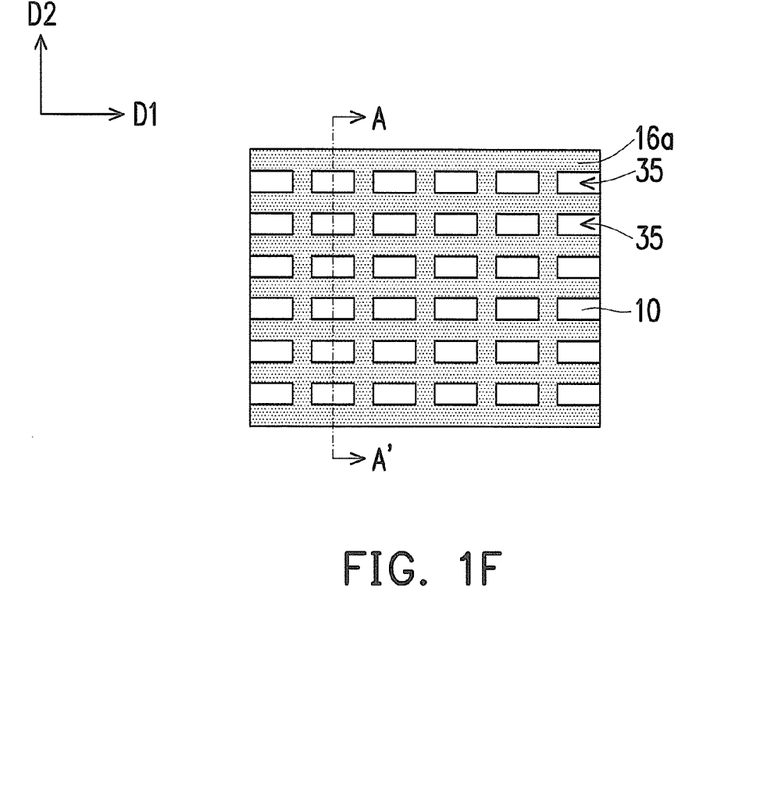

With reference to FIG. 1D to FIG. 1E and FIG. 2D to FIG. 2E, using the remained mask layer 22a and the underlying patterned filling material layer 20a as etching masks, a second etching process is performed to etch the hard mask layer 18 to form a patterned hard mask layer 18a, without etching the remaining filling material layer 20b. The second etching process may be an anisotropic etching process, such as a dry etching process with etching selectively toward the hard mask layer 18 over the filling material layer 20. From the top view of FIG. 1E, the remaining filling material layer 20b remains and openings 35 resultant from the removal of a portion of the hard mask layer 18 expose a portion of the stop layer 16. As the mask layer 22a is substantially removed in the second etching process, the underlying patterned filling material layer 20a is exposed. With reference to FIG. 1E, more specifically, the patterned filling material layer 20a, the patterned hard mask layer 18a and the remaining filling material layer 20b together form a mesh mask layer. In this embodiment, the holes 35 may have the same size. However, the invention is not limited thereto.

Figure 2C:
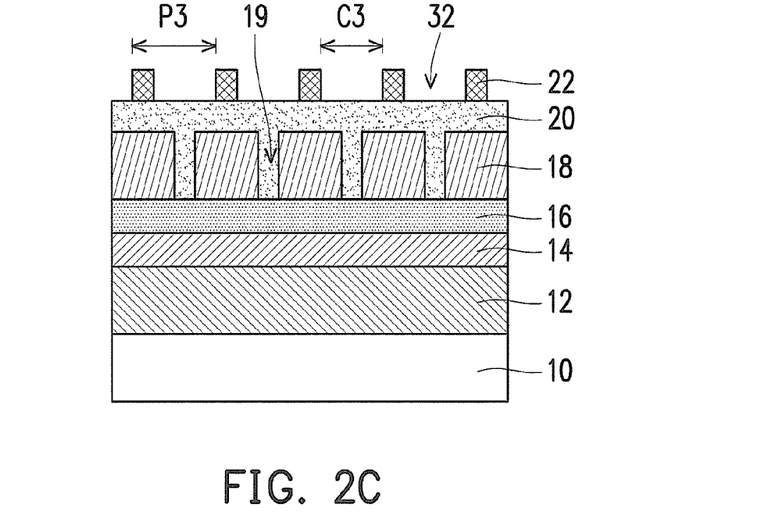
Figure 2D:
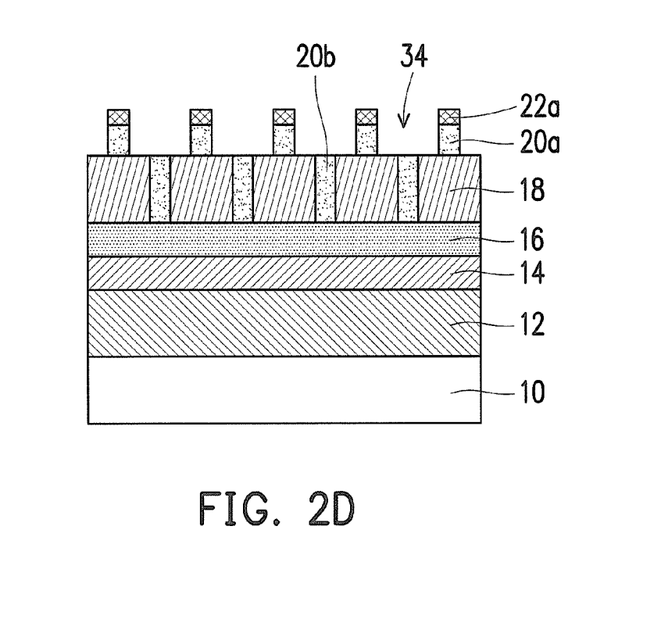
Figure 2E:
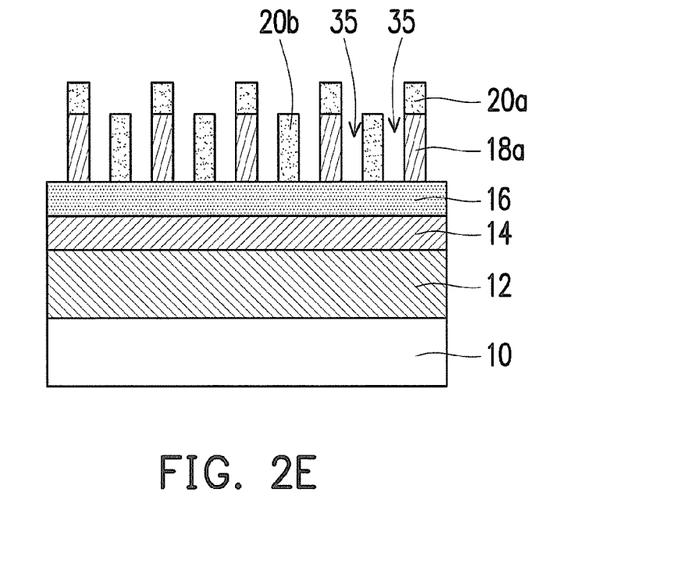
Figure 2F:
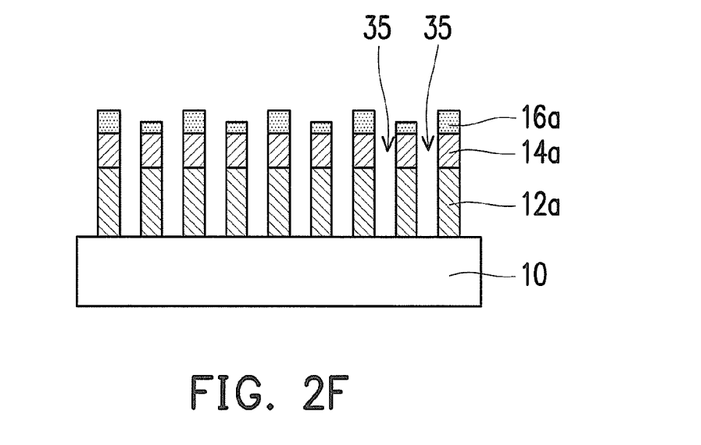

With reference to FIG. 1E to FIG. 1F and FIG. 2E to FIG. 2F, using the remaining filling material layer 20b together with the patterned filling material layer 20a and patterned hard mask layer 18a as etching masks, the stop layer 16, the removable hard mask layer 14 and the material layer 12 exposed by the holes 35 are etched, so as to form a patterned stop layer 16a, a patterned removable hard mask layer 14a and a patterned material layer 12a, as shown in FIG. 2F. This etching process may be an anisotropic etching process, such as a dry etching process. With reference to FIG. 2F, during the aforementioned etching process, the patterned filling material layer 20a, the patterned hard mask layer 18a and the remaining filling material layer 20b are removed and a portion of the exposed patterned stop layer 16a is also removed. The thickness (or height) of the remained patterned stop layer 16a may be varying.

Figure 1G:
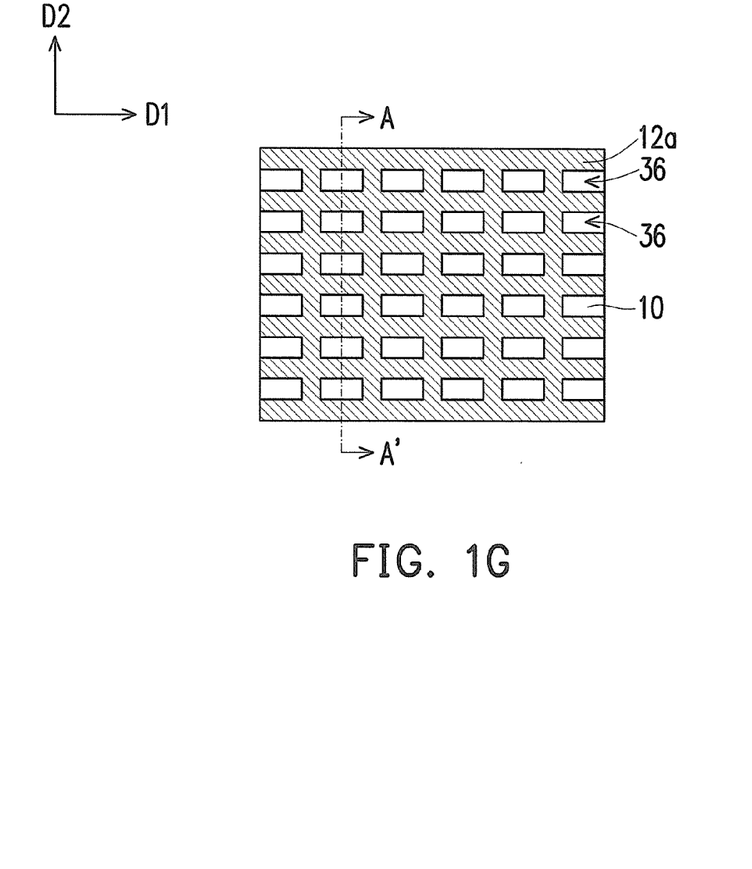

With reference to FIG. 1F to FIG. 1G and FIG. 2F to FIG. 2G, the remained patterned stop layer 16a and the patterned removable hard mask layer 14a are removed to expose the patterned material layer 12a. The patterned material layer 12a has a plurality of holes 36. As shown in FIG. 1G, the patterned material layer 12a includes a grid pattern defined by the holes 36 which are arranged in an array. In this embodiment, the holes 36 have equal sizes. However, the invention is not limited thereto. The dimension of the hole 36 in the second direction D2 can be calculated as (C3−C1)/2, while the dimension of the hole 36 in the first direction D1 is equivalent to C2. A pitch of the holes 36 is equivalent to the pitch P2 of the holes 32 in the first direction D1.

Figure 2G:
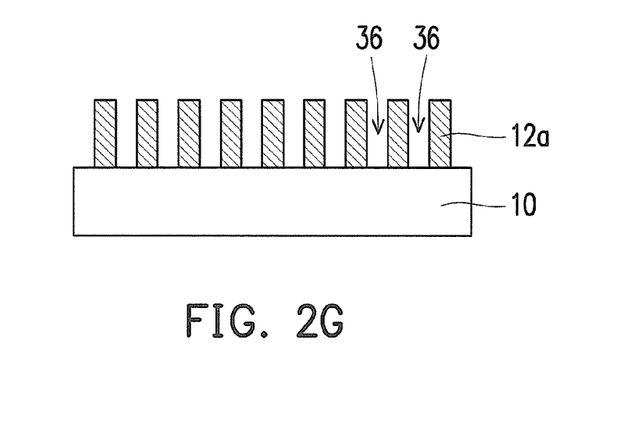
Figure 3:
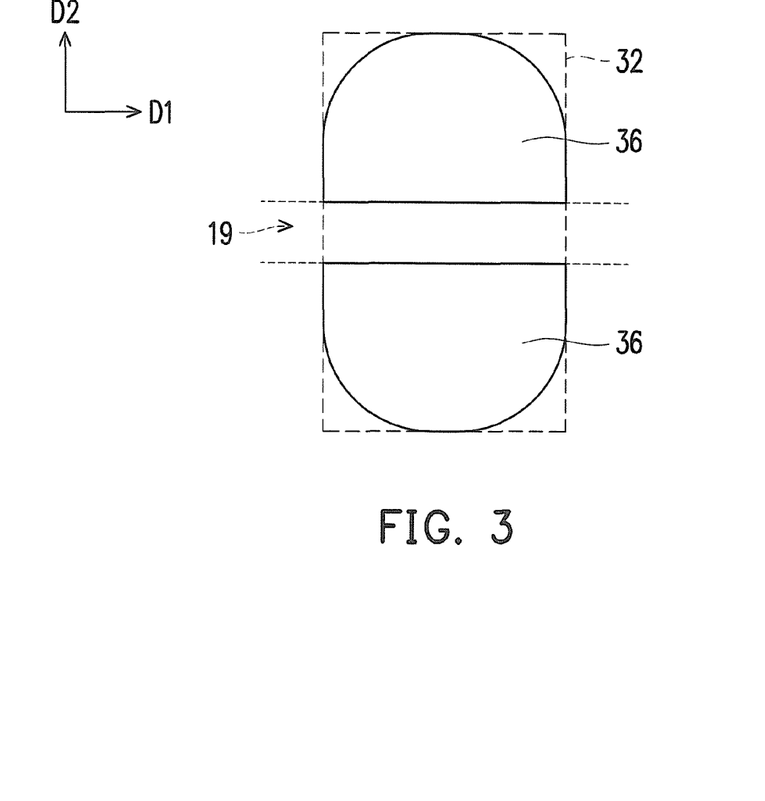
FIG. 3 is an enlarged view showing holes of a semiconductor structure according to an embodiment of the invention.

With reference to FIG. 1G and FIG. 2G, the structure of the semiconductor device according to the embodiment of the invention includes the patterned material layer 12a having a plurality of holes 36 disposed on the substrate 10. FIG. 3 is an enlarged view showing the holes of the patterned material layer of the semiconductor structure according to an embodiment of the invention. With reference to FIG. 1C, FIG. 2C and FIG. 1G, when forming the mask layer 22 on the filling material layer 20, as either of the trenches 19 is located in the middle of the two most adjacent first grid lines 24 (i.e. in the middle of the holes 32), the subsequently formed holes 36 may be considered as the etching results from the overlay of the holes 32 and the trenches 19. Accordingly, the holes 36 consists of a plurality of pairs of holes 36 corresponding to the locations of the holes 32, and within the location of one hole 32, one pair of holes 36 is formed. Each hole of the pair of the holes 36 has a side parallel to each other in the first direction D1. In FIG. 3, due to the corner rounding effect, the shapes of the holes 36 are illustrated as semi-ovals for emphasizing such rounding effect, but the shapes of the holes may be substantially square or rectangular.

Figure 4:
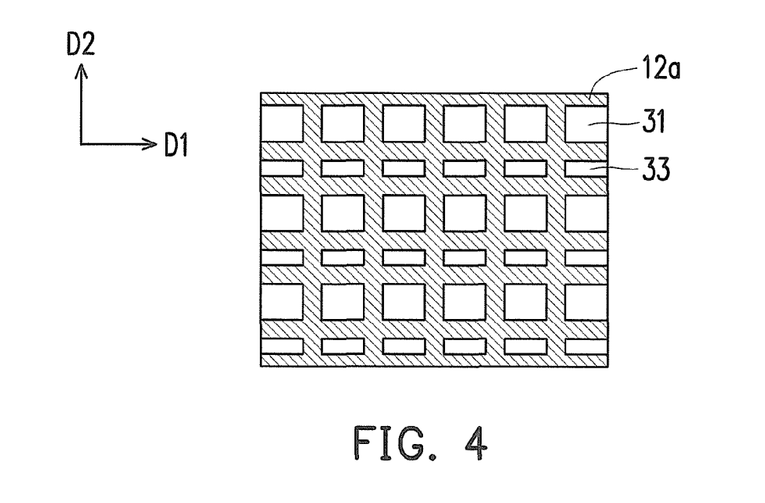
FIG. 4 is a schematic top view of the patterned material layer of the semiconductor structure according to another embodiment of the invention.

FIG. 4 is a schematic top view of the patterned material layer of the semiconductor structure according to another embodiment of the invention. As described above, when forming the mask layer 22 on the filling material layer 20, if the misalignment of the pattern occurs (e.g. shifted in D2 direction), from the top view of FIG. 4, each one of the trenches is arranged between two most adjacent first grid lines but not in the midst of the two most adjacent first grid lines according to another embodiment of the invention, the resultant holes 31 and 33 will have unequal sizes. Accordingly, the holes 31 and 33 of the patterned material layer 12a have different sizes, such as different CDs in the D2 direction for the holes 31 and 33 but the same CDs in the D1 direction, as shown in FIG. 4. In this case, even the misalignment of the mask occurs, the shifting of the pattern is lessened.

To sum up, according to the patterning method of the invention, a mask layer having a plurality of holes is overlaid on the underlying hard mask layer having a plurality of trenches to serve as the masks (i.e. double pattern mask layer) for a single etching process. It is understood that different conditions of lithography and different etchants or etching conditions may be applied for etching different material layer. By using the double pattern mask layer with a single etching process, smaller pattern pitch and smaller critical dimension can be formed in comparison with the conventional patterning method, and the resultant patterns are better aligned with less misalignment and better critical dimension uniformity. In addition, for the pattern of the patterned material layer of the semiconductor structure of the invention, at least the pattern shifting in one direction may be avoided and higher critical dimension uniformity is achieved.

It will be apparent to those skilled in the art that various modifications and variations can be made to the structure of the present invention without departing from the scope or spirit of the invention. In view of the foregoing, it is intended that the present invention cover modifications and variations of this invention provided they fall within the scope of the following claims and their equivalents.

What is claimed is:

1. A patterning method, comprising:
   providing a substrate comprising a material layer;
   forming a hard mask layer over the material layer, wherein the hard mask layer comprises a plurality of trenches extending in a first direction;
   forming a filling material layer on the hard mask layer, wherein the filling material layer covers the hard mask layer and fills in the trenches;
   forming a mask layer on the filling material layer, wherein the mask layer is in a grid pattern comprises a plurality of first grid lines extending in the first direction parallel to one another and a plurality of second grid lines extending in a second direction parallel to one another, and each of the plurality of trenches is located between two most adjacent first grid lines;
   etching the filling material layer with the mask layer as an etching mask to form a patterned filling material layer and a remaining filling material layer, wherein the remaining filling material layer fills in the trenches;
   etching the hard mask layer using the mask layer and the underlying patterned filling material layer as etching masks to form a patterned hard mask layer; and
   etching the material layer with the patterned hard mask layer, the patterned filling material layer and the remaining filling material layer as etching masks, so that a patterned material layer comprising a plurality of first holes and a plurality of second holes is formed.

2. The patterning method according to claim 1, wherein the mask layer has a plurality of third holes defined by the first grid lines and the second grid lines.

3. The patterning method according to claim 2, wherein the plurality of third holes is arranged in an array.

4. The patterning method according to claim 3, wherein a critical dimension of each of the third holes in the first direction is smaller than a critical dimension of each of the third holes in the second direction.

5. The patterning method according to claim 4, wherein a dimension of each of the plurality of the first holes in the first direction is equivalent to a dimension of each of the plurality of the second holes in the first direction, and is equivalent to the critical dimension of each of the third holes in the first direction.

6. The patterning method according to claim 1, wherein the plurality of first holes and the plurality of second holes are arranged in an array to define a grid pattern of the patterned material layer.

7. The patterning method according to claim 1, wherein when the mask layer is formed and each of the plurality of trenches is located between and in the midst of the two most adjacent first grid lines, the plurality of first holes and the plurality of second holes of the patterned material layer have equal sizes.

8. The patterning method according to claim 1, wherein when the mask layer is formed and each of the plurality of trenches is located between but not in midst of the two most adjacent first grid lines, the plurality of first holes and the plurality of second holes of the patterned material layer have different sizes.

9. The patterning method according to claim 1, wherein the hard mask layer includes advanced patterning film.

10. The patterning method according to claim 1, wherein the filling material layer is a silicon-containing hard-mask layer formed by spin-coating method.

11. The patterning method according to claim 1, further comprising forming a removable hard mask layer and a stop layer in sequence on the material layer beneath the hard mask layer.

12. The patterning method according to claim 11, wherein the removable hard mask layer includes advanced patterning film.

13. The patterning method according to claim 11, wherein a material of the stop layer includes silicon nitride (SiN).

* * * * *